United States Patent
DeClue et al.

(10) Patent No.: US 6,281,715 B1
(45) Date of Patent: Aug. 28, 2001

(54) LOW VOLTAGE DIFFERENTIAL SIGNALING DRIVER WITH PRE-EMPHASIS CIRCUIT

(75) Inventors: Larry W. DeClue, Saratoga; James Chow, Palo Alto; Kenny Wen, San Jose, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/408,773

(22) Filed: Sep. 29, 1999

Related U.S. Application Data

(63) Continuation-in-part of application No. 09/069,554, filed on Apr. 29, 1998, now abandoned.

(51) Int. Cl.$^7$ .................................................. H03K 5/22
(52) U.S. Cl. ............................................ 327/65; 327/108
(58) Field of Search ................................. 327/63–66, 68, 327/69, 76, 85, 51–53, 108; 326/83, 86

(56) References Cited

U.S. PATENT DOCUMENTS

| | | | |
|---|---|---|---|
| 3,495,223 | 2/1970 | Martin, Jr. ............................ | 340/174 |
| 4,084,070 | 4/1978 | Reed et al. ............................ | 178/69 |
| 4,556,805 | 12/1985 | Shoji .................................... | 307/359 |
| 4,775,844 | 10/1988 | Snyder ................................. | 330/298 |
| 4,791,314 | 12/1988 | Kuo et al. ............................ | 307/270 |
| 4,845,386 | 7/1989 | Ueno .................................... | 307/446 |
| 4,884,165 | 11/1989 | Kong et al. .......................... | 361/98 |
| 4,987,318 | 1/1991 | Burke et al. ......................... | 307/443 |
| 5,083,051 | 1/1992 | Whatley et al. ..................... | 307/571 |
| 5,179,358 | 1/1993 | Martin ................................. | 331/1 A |
| 5,243,347 | 9/1993 | Jackson et al. ..................... | 341/144 |
| 5,404,051 | 4/1995 | Kobayashi .......................... | 327/170 |
| 5,424,683 | 6/1995 | Takahashi ........................... | 330/255 |
| 5,444,446 | 8/1995 | Gopinathan et al. ............... | 341/135 |
| 5,530,271 | 6/1996 | Fallica ................................. | 257/173 |
| 5,576,634 | 11/1996 | Kamiya ............................... | 326/26 |
| 5,604,417 | 2/1997 | Kaminaga et al. .................. | 320/17 |
| 5,614,848 | 3/1997 | Kaminaga et al. .................. | 326/110 |
| 5,632,019 | 5/1997 | Masiewicz .......................... | 395/250 |
| 5,721,504 | 2/1998 | Sato .................................... | 327/309 |
| 5,754,038 | 5/1998 | Durec et al. ........................ | 323/313 |
| 5,767,699 | 6/1998 | Bosnyak et al. .................... | 326/86 |
| 5,801,578 | 9/1998 | Bereza ................................ | 327/536 |
| 5,812,021 | 9/1998 | Ikeda .................................. | 327/541 |
| 5,839,537 | 11/1998 | Nishino et al. ..................... | 180/443 |
| 6,005,438 | * 12/1999 | Shing ................................. | 330/253 |

* cited by examiner

Primary Examiner—My-Trang Nuton
(74) Attorney, Agent, or Firm—Stallman & Pollock LLP

(57) ABSTRACT

A low voltage differential signaling ("LVDS") line driver includes a pre-emphasis circuit to increase the drive capability of the LVDS line driver. A current source provides a first drive current to a current steering circuit. The pre-emphasis circuit includes a second current source, a current sourcing circuit coupled to the second current source and the current steering circuit and a current sinking circuit coupled to the second current source and the current steering circuit. In this way, first and second drive currents are provided to during the switching of the signal states of an input signal, so that more drive current is supplied to the output of the LVDS line driver circuit. Thus, the time it takes for the current steering circuit to switch the drive current between the first and second directions is decreased.

28 Claims, 8 Drawing Sheets

LOW VOLTAGE DIFFERENTIAL SIGNALING DRIVER WITH PRE-EMPHASIS CIRCUIT

"The present application is a continuation-in-part application of U.S. patent application No. 09/069,554 filed Apr. 29, 1998 now abandoned and titled Low Voltage Differential Signaling Driver with Pre-emphasis Circuit, now abandoned, the contents of which are incorporated herein by reference."

BACKGROUND OF THE INVENTION

1. Field of the Invention

The present invention relates to the field of transistor driver circuits and in particular, to a low voltage differential signaling ("LVDS") driver with pre-emphasis.

2. Description of the Related Art

The constant need to transfer more information faster, accompanied by increases in data processing capability, necessitated an expansion to data transfer rates considerably higher than what was previously possible. As a consequence, a protocol referred to as 100 Base-T was developed for extending IEEE Standard 802.3 to accommodate data moving at an effective transfer rate of 100 Mbps through twisted-pair cables. Under the 100 Base-T protocol, certain control bits are incorporated into the data before it is placed on a twisted-pair cable. The result is that the data and control signals actually move through a twisted-pair cable at 125 Mbps.

One type of data transmission is differential data transmission in which the difference in voltage levels between two signal lines forms the transmitted signal. Differential data transmission is commonly used for data transmission rates greater than 100 Mbps over long distances. Noise signals shift the ground level voltage and appear as common mode voltages. Thus, the deleterious effects of noise are substantially reduced.

To standardize such data transmission various standards have been promulgated. For example, one such standard is the recommended standard 422, RS422, which is defined by the Electronics Industry of America, EIA. This standard permits data rates up to 10 million baud over a twisted pair of signal lines. Driver circuits place signals on the lines. These drivers circuits must be capable of transmitting a minimum differential signal in the range of two to three volts on the twisted pair line which typically terminates in 100 ohms of resistance.

A recently emerging recommended standard is the RS-644 standard. This is a low voltage differential signaling ("LVDS") standard which is high speed, low power, low electromagnetic interference ("EMI") and low in cost. Due to the differential implementation, the LVDS driver can be used in noisy environments.

An example of a conventional low voltage differential signaling (LVDS) driver circuit 100 is shown in FIG. 1. The difference in voltage between the output signals OUT+, OUT− on the output terminals 103, 105 forms the pair of differential signals. A pair of differential signals means two signals whose current waveforms are out of phase with one another. The individual signals of a pair of differential signals are indicated by reference symbols respectively ending with "+" and "−" notation, e.g., S+ and S−.

LVDS driver circuit 100 includes a direct current (DC) constant current source I1 coupled to voltage supply VDD, four n-channel metal oxide semiconductor (NMOS) switches M11–M14, and a resistor R1 coupled between the common node COM and voltage supply VSS. The four transistor switches M11–M14 are controlled by input voltage signals VIN1, VIN2 and direct current through load resistor Rt as indicated by arrows A and B. The input voltage signals VIN1, VIN2 are typically complementary rail-to-rail voltage swings.

The gates of NMOS switches M11 and M14 couple together to receive input voltage signal VIN1. Similarly, the gates of NMOS switches M12 and M13 couple together to receive input voltage signal VIN2.

Operation of LVDS driver circuit 100 is explained as follows. Two of the four NMOS switches M11–M14 turn on at a time to steer current from current source I1 to generate a voltage across resistive load Rt. To steer current through resistive load Rt in the direction indicated by arrow B, input signal VIN2 goes high turning on NMOS switches M12 and M13. When input signal VIN2 goes high, input signal VIN1 goes low to keep NMOS switches M11 and M14 off during the time NMOS switches M12 and M13 are on. Conversely, to steer current through resistive load Rt in the direction indicated by arrow A, input signal VIN1 goes high and is applied to transistor switches M11 and M14 to make them conduct. Input signal VIN2 goes low to keep NMOS switches M12 and M13 off during this time. As a result, a full differential output voltage swing can be achieved.

Differential LVDS driver circuit 100 may operate well at low frequencies. However, the problem arises that the output switching current is limited by DC constant current source I1. Since the switching speed of differential LVDS driver circuit 100 is proportional to the amount of drive current from current source I1, such limited drive current results in a slow switching speed of LVDS driver circuit 100. When either of the output transistors M11, M13 are switched on, the drain current responds slowly because of the limited amount of drive current. Thus, for example, when transistors M12 and M13 are switched on, there is a significant delay in the time it takes for the drain of transistor M13 to be pulled up by the current source I1 to voltage supply VDD and a significant delay in the time it takes for the source of transistor M12 to be pulled down towards voltage supply VSS. Such delay caused by the limited drive current from DC current source I1 reduces the amplitude of the differential voltage output swing at high frequencies and causes disturbances, such as noise, when LVDS driver 100 drives a heavy load, such as a long cable or a high capacitance cable.

Therefore, a need exists for an LVDS driver with an increased switching speed to maintain the DC amplitude of the voltage output swing both at high frequency and when the LVDS driver drives a heavy load.

SUMMARY OF THE INVENTION

A low voltage differential signaling ("LVDS") line driver in accordance with the present invention includes a pre-emphasis circuit. In response to an input signal changing signal states, a current steering circuit switches the direction of drive currents to provide a differential output signal. A current source provides a first drive current to the current steering circuit. To increase the speed in which the switching takes place, the pre-emphasis circuit provides a second drive current to the current steering circuit when the input signal changes signal states. The current steering circuit directs these drive currents in a first and a second direction to form a differential output signal at the output nodes.

The pre-emphasis circuit of an LVDS line driver in accordance with one embodiment of the present invention includes a current sourcing circuit and a current sinking circuit. During the switching transition the current sourcing circuit pushes the drive current from a voltage supply to the current steering circuit and the current sinking circuit pulls current from the current steering circuit toward circuit ground.

A pre-emphasis circuit in accordance with still another embodiment of the present invention includes a delay circuit coupled to a logic circuit to ensure that the second drive current is supplied to the current steering circuit during the switching transition. The delay circuit delays the input signal received by one of the inputs to the logic circuit. The other logic circuit input receives the input signal directly. Thus, it takes longer for the delayed input signal to arrive at the logic circuit than it takes for the input signal directly input to the logic circuit. Due to the delay provided by the delay circuit, for a brief time during the switching transition, both the delayed input signal and the input signal have the same signal level. For this time the logic circuit outputs a transition signal. The current sourcing receives this transition signal and supplies the second drive current to the current steering circuit and the current sinking circuit receives this transition signal and pulls the current steering signal toward circuit ground. In a particular embodiment, the logic circuit is an exclusive-NOR gate and the delay circuit comprises inverters.

A pre-emphasis circuit in accordance with yet another embodiment of the present invention includes a second current source, a current sourcing circuit and a second current steering circuit. In this embodiment the second current steering circuit couples to the output nodes and the current sourcing circuit couples between the second current source and the second current steering circuit. In this way, during the switching transition, the current sourcing circuit sources a second drive current from the second current source to the second current steering circuit such that both the first and second drive currents are provided to the output nodes.

These and other features and advantages of the present invention will be understood upon consideration of the following detailed description of the invention and the accompanying drawings.

DESCRIPTION OF THE PREFERRED EMBODIMENT

Figure 2:
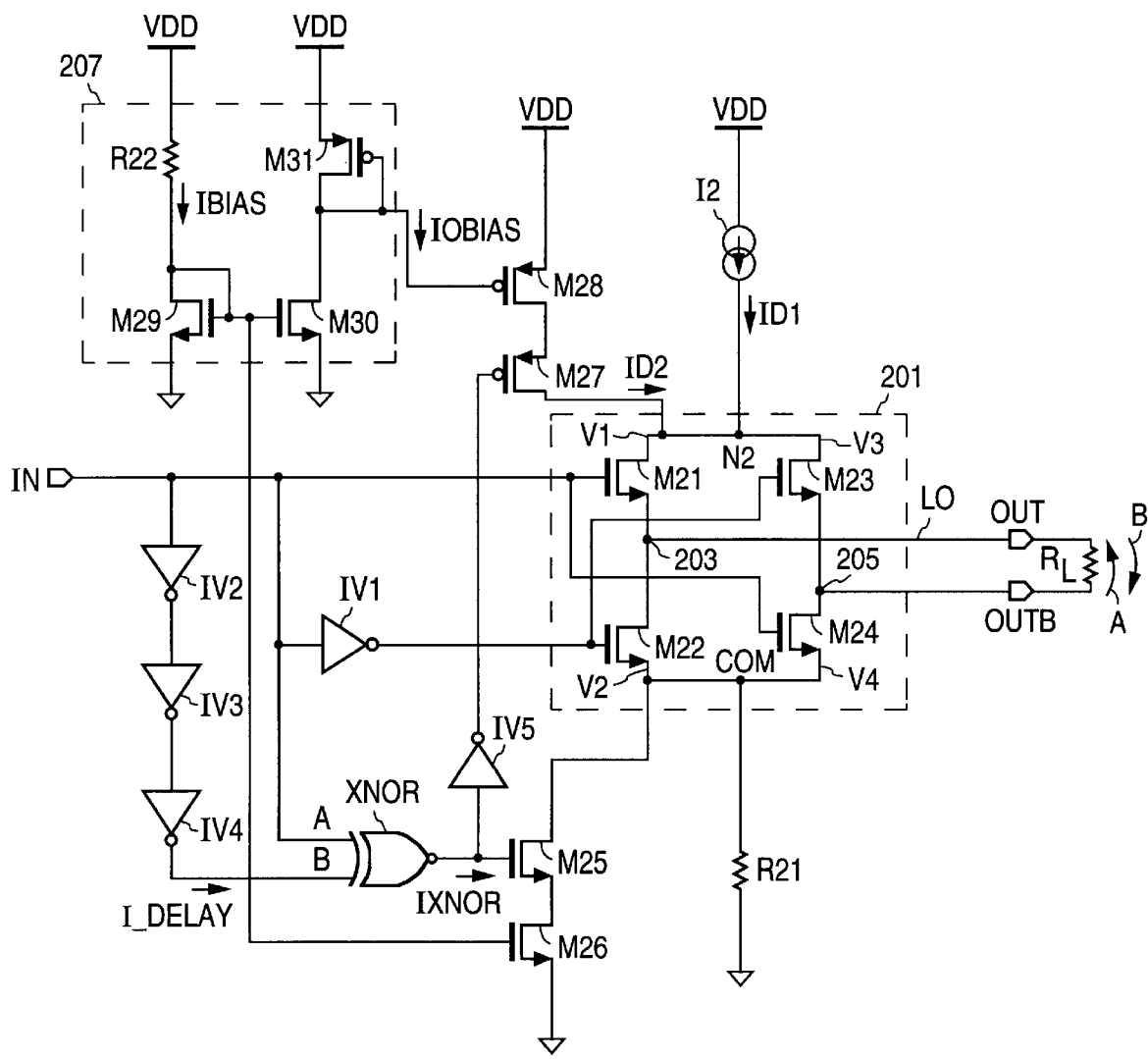
FIG. 2 illustrates a low voltage differential signaling circuit in accordance with the present invention.

In accordance with an illustrative embodiment of the invention, an LVDS driver with pre-emphasis 200 is shown in FIG. 2. The LVDS driver with pre-emphasis 200 includes a direct current (DC) constant current source 12 coupled between voltage supply VDD and current steering circuit 201, current reference circuit 207, and current sources M25–M28.

Current source 12 supplies a constant drive current ID1 to current steering circuit 201. An additional drive current ID2 is supplied to current steering circuit 201 from transistors M27, M28. Also included in FIG. 2 is resistor R21 which establishes a DC voltage to satisfy high output voltage VOH and low output voltage VOL. In particular, low output voltage equals:

$$VOL = (ID1+ID2)*R21 + V_{DS,M22/M24} \quad (1)$$

Where $V_{DS,M22/M24}$ is the drain-source voltage of either transistor M22 or transistor M24. Since drain-source voltage $V_{DS,M22/M24}$ is usually small, resistor R21 is typically the dominant factor in low output voltage VOL. High output voltage VOH equals:

$$VOH = VOL + (ID1+ID2)*RL \quad (2)$$

Where RL is an external load resistor. Substituting equation (1) into equation (2) yields:

$$VOH \approx (ID1+ID2)*R21 + (ID1+ID2)*RL \quad (3)$$

Therefore, resistor R21 is important in establishing both low voltage output VOL and high output voltage VOH.

Current steering circuit 201 has a modified H-bridge circuit configuration. A load segment LO extends horizontally and contains resistive load RL. This load segment LO couples between end nodes 203, 205. Vertical segment V1 extends between left end node 203 and node N2. Connected between left end node 203 and common node COM is vertical segment V2. Vertical segment V3 extends between right end node 205 and node N2, while vertical segment V4 extends between right end node 205 and common node COM. Coupled between the common node COM and voltage supply VSS is resistor R21. The reference to "vertical" and "horizontal" orientations of the segments of the modified H-bridge current steering circuit 200 are, of course, merely for descriptive purposes and do not necessarily describe the actual layout of the circuit 201. Each of the vertical segments V1, V2, V3, V4 contains a respective NMOS switch M21, M22, M23, M24.

The switches M21–M24 are controlled by input signal IN which is typically a rail to rail voltage level, so input signal IN typically is either "high" or "low." Input signal IN is applied to the gates of transistors M21–M24, to direct drive currents ID1, ID2 through the load resistor RL as indicated by arrows A and B. As used herein, the term "gate" broadly encompasses any form of control lead for changing the switching state of a device. As such, the term "gate" is intended to be synonymous with the "base" of a bipolar transistor, for example. As illustrated in FIG. 2, input signal IN is input to inverter IV1 before being applied to the gates of transistors M22 and M23. As a result, these transistors M22, M23 are off when transistors M21, M24 are on, and are on when transistors M21, M24 are off.

The switching transition of switches M21–M24 occurs when input signal IN changes from high to low or from low to high. When input signal IN is high, MOS switches M21 and M24 turn on and steer the drive currents ID1, ID2 through load resistor RL in the direction indicated by arrow B. Since input signal IN also goes through inverter IV1, a low voltage level from inverter IV1 is applied to MOS switches M22 and M23 to keep these switches off during this time. When current steering circuit 201 steers the drive currents ID1, ID2 in this direction, the voltage at output node 205 is pulled low and the voltage at the output node 203 is pulled high. Thus, since output transistor M21 is on, the output high voltage VOH is the voltage at output node 203 and the output low voltage VOL is the voltage at output node 205.

When input signal IN goes from high to low, switches M21 and M24 switch off. A high voltage level from inverter IV1 is applied to MOS switches M22 and M23 to switch them on to direct current through resistive load RL in the direction indicated by arrow A. When current steering circuit 201 steers the drive currents ID1, ID2 in this direction, the voltage at output node 205 is pulled high and the voltage at the output node 203 is pulled low. Thus, since output transistor M23 is on, the output high voltage VOH is the voltage at output node 205 and the voltage low voltage VOL is the voltage at output node 203.

The pre-emphasis circuit includes transistors M25–M28, inverters IV2–IV5 and an exclusive-NOR gate XNOR. Operation of the pre-emphasis circuit will now be discussed. Input signal IN is applied to two inputs A, B of exclusive-NOR gate XNOR. Input signal IN is applied directly to input A of exclusive-NOR gate XNOR and also is applied to input B of exclusive-NOR gate XNOR after going through several inverters IV2–IV4.

The typical truth table for an exclusive-NOR gate is shown below.

| a | b | Output |
|---|---|--------|
| 0 | 0 | 1 |
| 0 | 1 | 0 |
| 1 | 0 | 0 |
| 1 | 1 | 1 |

Where "a" and "b" are inputs to the exclusive-NOR gate and "output" is the output of the exclusive-NOR gate. Due to inverters IV2–IV4 it would seem that the signal level received by input A of exclusive-NOR gate XNOR would always be opposite to that received by input B. Therefore, it would be expected that the truth table for exclusive-NOR gate XNOR would be as shown below.

| Input signal IN | A | B | IXNOR |
|-----------------|---|---|-------|
| 0 | 0 | 1 | 0 |
| 1 | 1 | 0 | 0 |

Where A and B are inputs to exclusive-NOR gate XNOR and IXNOR is the output of exclusive-NOR gate XNOR. However, inverters IV2–IV4 provide delay matching. Thus, it takes longer for input signal IN travelling through inverters IV2–IV4 to arrive at input B of exclusive-NOR gate XNOR than it takes for input signal IN to arrive at input A. Due to this delay provided by inverters IV2–IV4, inputs A and B of exclusive-NOR gate XNOR receive signals having the same signal level for a brief time during each switching transition of switches M21–M24. When this situation occurs, exclusive-NOR gate XNOR outputs a signal IXNOR to turn on transistors M25 and M27.

Typically, it is desirable that transistors M25 and M27 turn on at virtually the same time. Therefore, the delay provided by inverter IV5 should be as small as possible so as to minimize the time difference between when each of these transistors M25, M27 turn on. The delay provided by exclusive-NOR gate XNOR should also be minimal so as to output transition signal XNOR during the brief period of time in which input signal IN and delay signal IDELAY have the same signal level.

In contrast to the desirable quickness with which inverter IV5 and exclusive-NOR gate XNOR operate, inverters IV–IV4 operate slower to add delay so that transistors M25 and M27 turn on during the output switching time of transistors M21–M24. In addition, as illustrated in FIG. 2, transistor M27 is a P-channel MOS ("PMOS") transistor and transistor M25 is an N-channel MOS transistor ("NMOS"). Since a PMOS transistor typically has a wider channel than an NMOS transistor, the size (W/L, where W is the width of the transistor channel and L is the length of the transistor channel) of PMOS M27 will typically be larger than that of NMOS M25. In one exemplary embodiment, inverters IV2–IV4 all together delay the input signal IN by approximately 500 picoseconds, exclusive-NOR gate XNOR provides a delay of approximately 300 picoseconds, inverter IV5 provides a delay of approximately 100 picoseconds, and PMOS M27 is approximately 1.5–2.5 times the size of transistor NMOS M25. These delay times and transistor sizes are for exemplary purposes only and are not intended to limit the present invention to specific parameters.

It will appreciated that although three inverters IV2–IV4 are illustrated in FIG. 2, any number of inverters can be included to provide the desired delay. It will also be appreciated that although exclusive-NOR gate XNOR is illustrated in FIG. 2, any type of logic circuit can be used to turn on transistors M25 and M27 during the switching transition of switches M21–M24 which occurs when input signal IN changes from high to low or from low to high.

Figure 1:
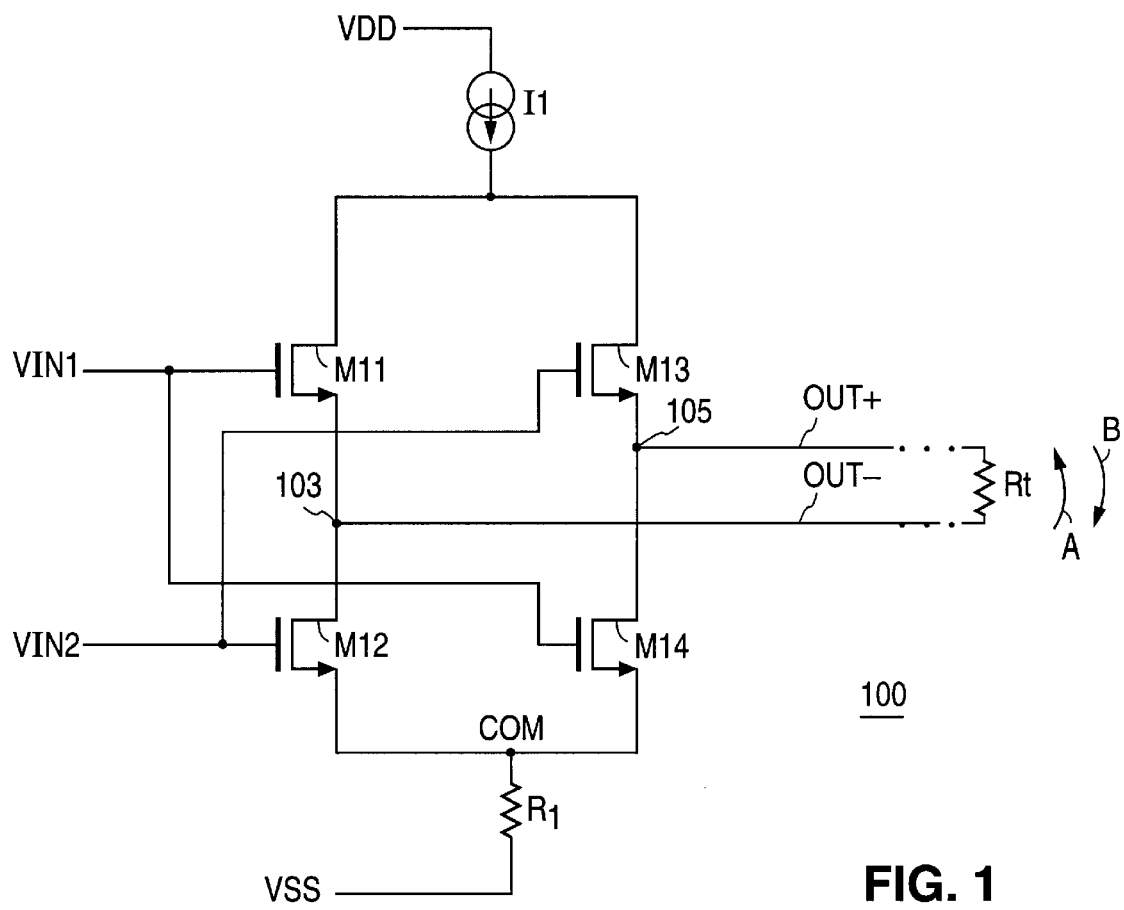
FIG. 1 illustrates a conventional low voltage differential signaling circuit.
Figure 3:
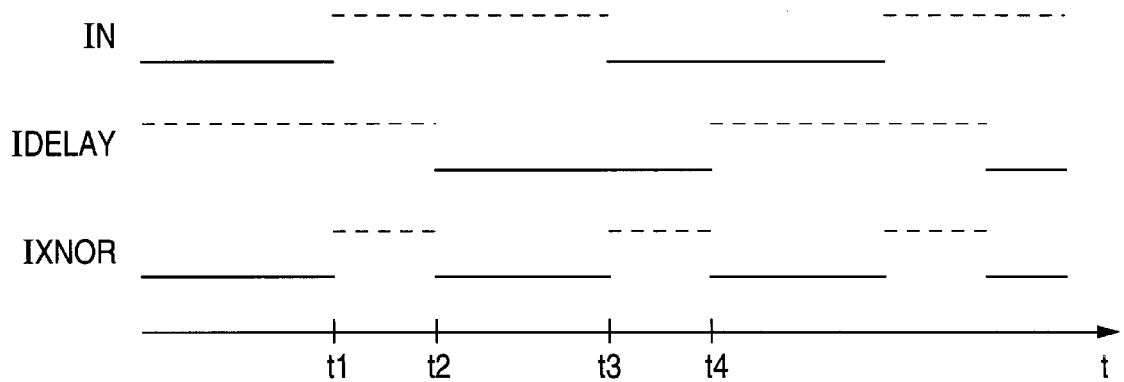
FIG. 3 illustrates a signaling diagram of the low voltage differential signaling circuit in accordance with the present invention.

FIG. 3 illustrates a switching timing diagram of the signaling in accordance with the present invention. The timing diagram depicts the signal levels of input signal IN, delay signal IDELAY which is the output signal of inverter IV4, and output signal IXNOR, with respect to time. As can be seen in the figure, between times t1 and t2 and between times t3 and t4, both delay signal IDELAY and input signal IIN are equal, yielding a high output signal IXNOR. The time duration of this high output signal IXNOR begins when input signal IN switches between high and low signal levels, and ends when delay signal IDELAY switches between high and low signal levels. Thus, exclusive-NOR gate XNOR generates a positive pulse at each input signal IN transition from high to low or from low to high.

Referring now to FIGS. 2 and 3, when output signal IXNOR is high, both transistors M25 and M27 turn on. Thus, these transistors M25, M27 are on between times t1 and t2, and between times t3 and t4. Current reference circuit 207 provides bias currents IBIAS, IOBIAS to transistors M26 and M28 to keep these transistors M26, M28 on. In an exemplary transistor M26 is approximately the same size (W/L) as transistor M25, and transistor M28 is approximately the same size (W/L) as transistor M27. Thus, when transistor M25 turns on, transistors M25 and M26, operating as current sources, pull current from current steering circuit 201 toward circuit ground. When transistor M27 turns on, transistors M27 and M28, operating as current sources, push current from voltage supply VDD into current steering circuit 201. This additional drive current ID2 provides the pre-emphasis to LVDS driver 200.

Current reference circuit 207 includes transistors M29–M31 and resistor R22. The pre-emphasis provided by the addition of drive current ID2 to current steering circuit 201 is controlled by bias current IBIAS. Bias current IBIAS is derived from resistor R22, which couples between voltage supply VDD and the input of a current mirror circuit comprised of transistors M29 and M30. In particular, the gates of both transistors M29, M30 couple together, transistor M29 has its gate and drain coupled together, and the sources of both transistors M29, M30 couple to circuit ground. It will be appreciated that the value of resistor R22 can be selected depending upon the length of the transmission cable and the operating frequency. It will also be appreciated that resistor R22 can be designed to be either internal to the chip or external.

Bias current IBIAS is received by transistor M29 and output bias current IOBIAS is taken at the drain of transistor M30. Diode-coupled transistor M31 couples to the drain of transistor M30 and to the gate of transistor M28. In this way, bias current IBIAS is applied to transistor M26 and output current IOBIAS is applied to transistor M28 to keep these transistors on. Although a particular schematic of current reference circuit 207 has been illustrated, it will be appreciated that such schematic is only for exemplary purposes. Any circuit capable of generating a bias current to turn on transistors M26 and M28 may be used.

When transistors M25 and M27 turn on during the switching transition period of switches M21–M24, corresponding to the transition of input signal IN, extra drive current ID2 flows from voltage supply VDD through transistors M28 and M27 to current steering circuit 201. As a result, more drive current is flowing into current steering circuit 201 than from current source 12 alone. Such additional current improves the transition time of LVDS driver with pre-emphasis 200. In addition, current is pulled from current steering circuit 201 through transistors M25 and M26 toward circuit ground. By pulling current from the circuit 201 in this way, line driver circuit 200 is able to more quickly pull low, output low voltage VOL. The following equation illustrates the relation between current I, time t, voltage swing v, and capacitance C of the load.

$$C*v = I*t \qquad (4)$$

Typically, the capacitance C of the load and the voltage swing v are fixed values. Therefore, as can be seen by equation (4), by varying the amount of current I supplied to current steering circuit 201, the switching transition time t can be adjusted. Thus, when current I is increased by supplying drive current ID2, the value of switching transition time t decreases, indicating a faster switching transition time t.

In addition to improving the switching transition time of line driver circuit 200, the pre-emphasis circuit provides other advantages. For example, when LVDS driver with pre-emphasis 200 operates at lower frequencies, the current consumption is decreased. Since input signal IN has fewer transitions at low frequency, transistors M25, M27 turn on less frequently. Therefore, LVDS driver 200 consumes less current. In addition, since little to no DC current is used when line driver circuit 200 is not switching, further conservation of current can be achieved.

Figure 4:
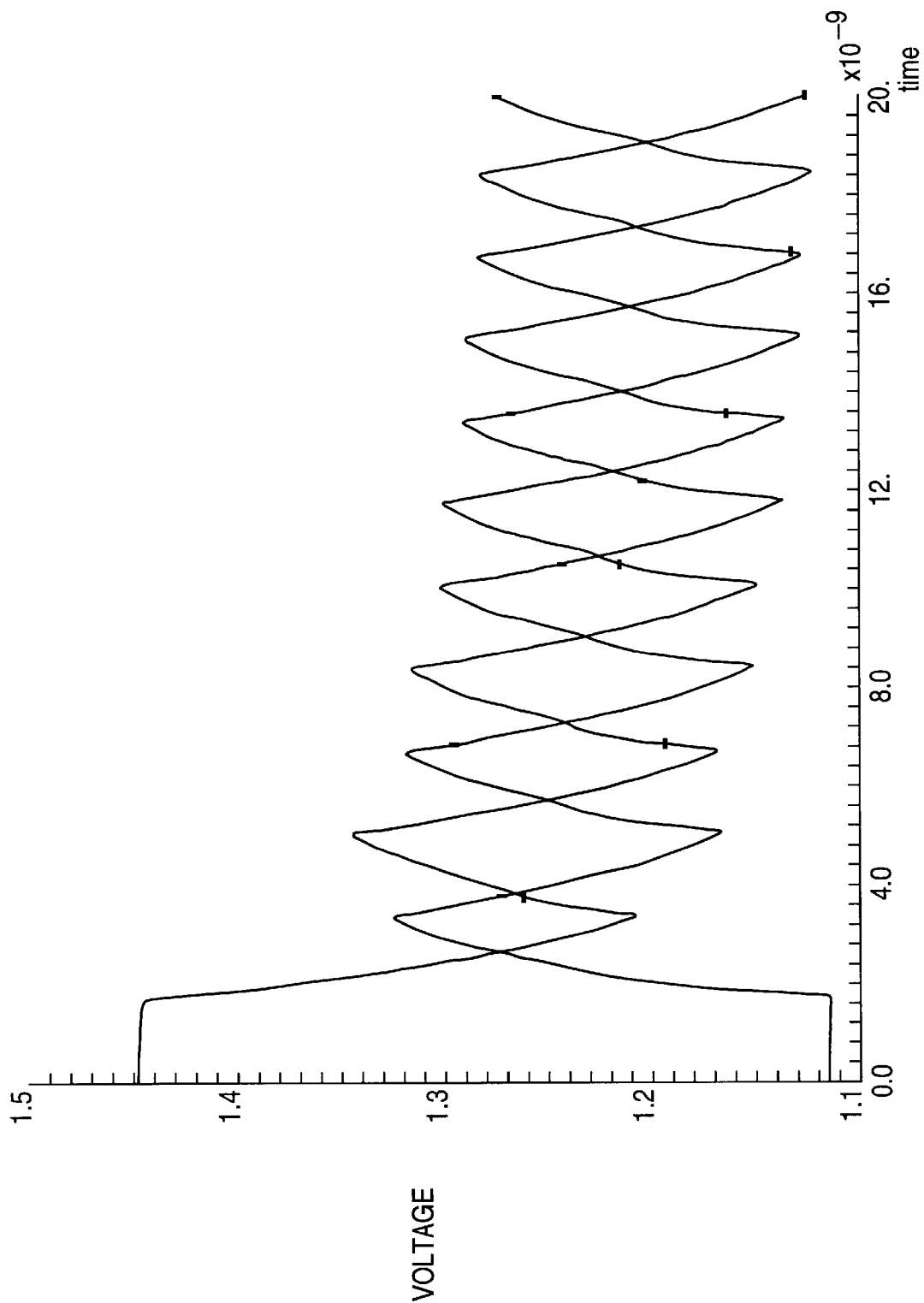
FIG. 4 illustrates a transient analysis of results of a conventional low voltage differential signaling circuit.
Figure 5:
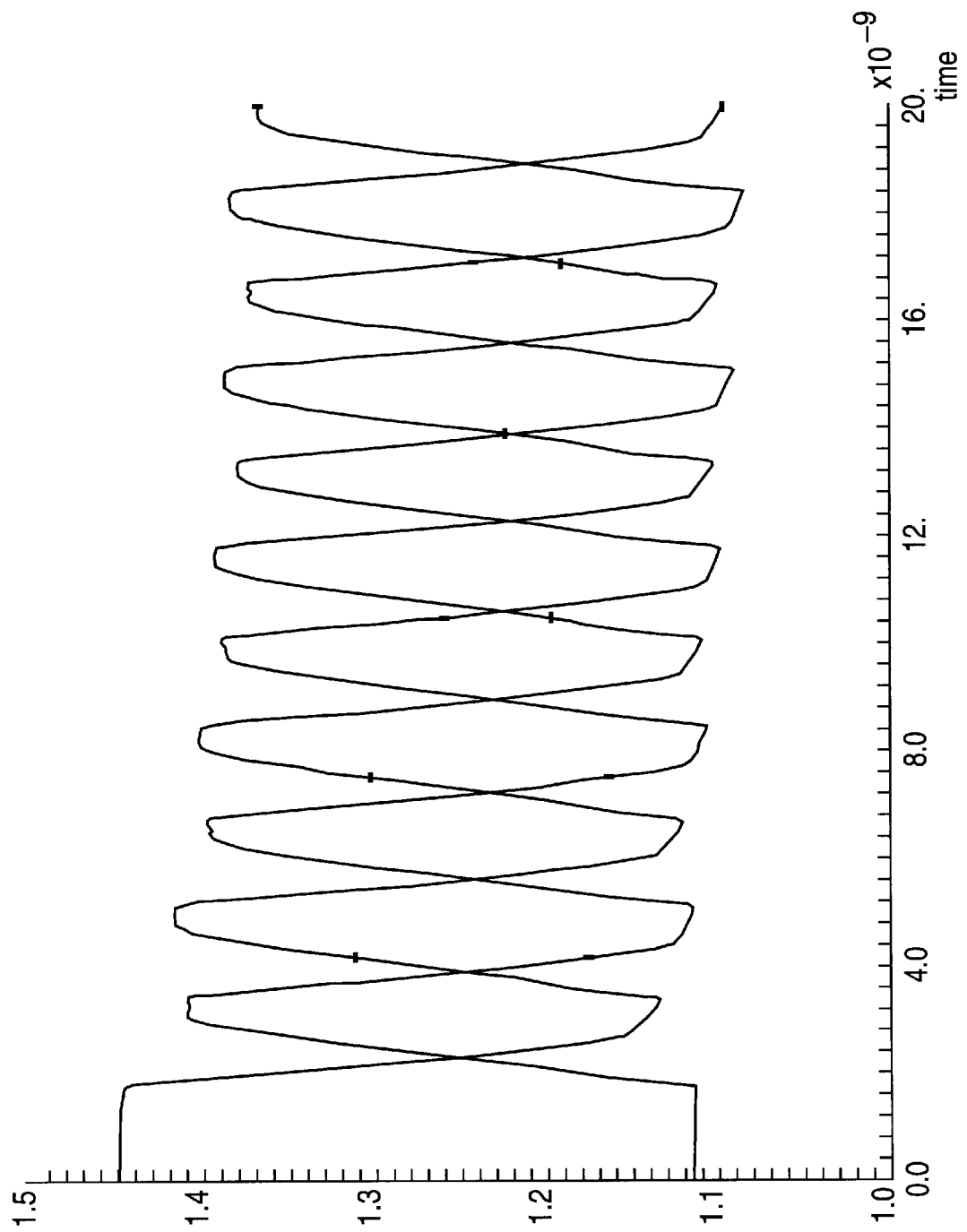
FIG. 5 illustrates a transient analysis of results of the low voltage differential signaling circuit in accordance with the present invention.

FIGS. 4 and 5 illustrate transient analysis results obtained with simulated currents of a conventional line driver circuit similar to that of line driver circuit 100, and LVDS driver with pre-emphasis 200, respectively. Both simulations were conducted at a frequency of 300 MHz and with a 25 picofarad capacitive loading. As illustrated in FIG. 4, at high frequency or heavy load, the amplitude of the voltage output swing of the conventional line driver is much smaller than that at DC current.

FIG. 5 illustrates results of LVDS driver with pre-emphasis 200. The output voltage swing of LVDS driver with pre-emphasis 200 is much larger than that shown in FIG. 4, and shows very little amplitude variation from DC current level. The output voltage swing can be adjusted to reach the desired amplitude. LVDS driver with pre-emphasis 200 also has several other advantages, such as an improvement of the high frequency output response and reduced jitter with lower bit error rate. LVDS driver with pre-emphasis 200 also can be used in longer cable applications. Finally, circuit implementation is simple and small in both transistor count and layout area making it easy to integrate into many integrated circuit designs.

Figure 6:
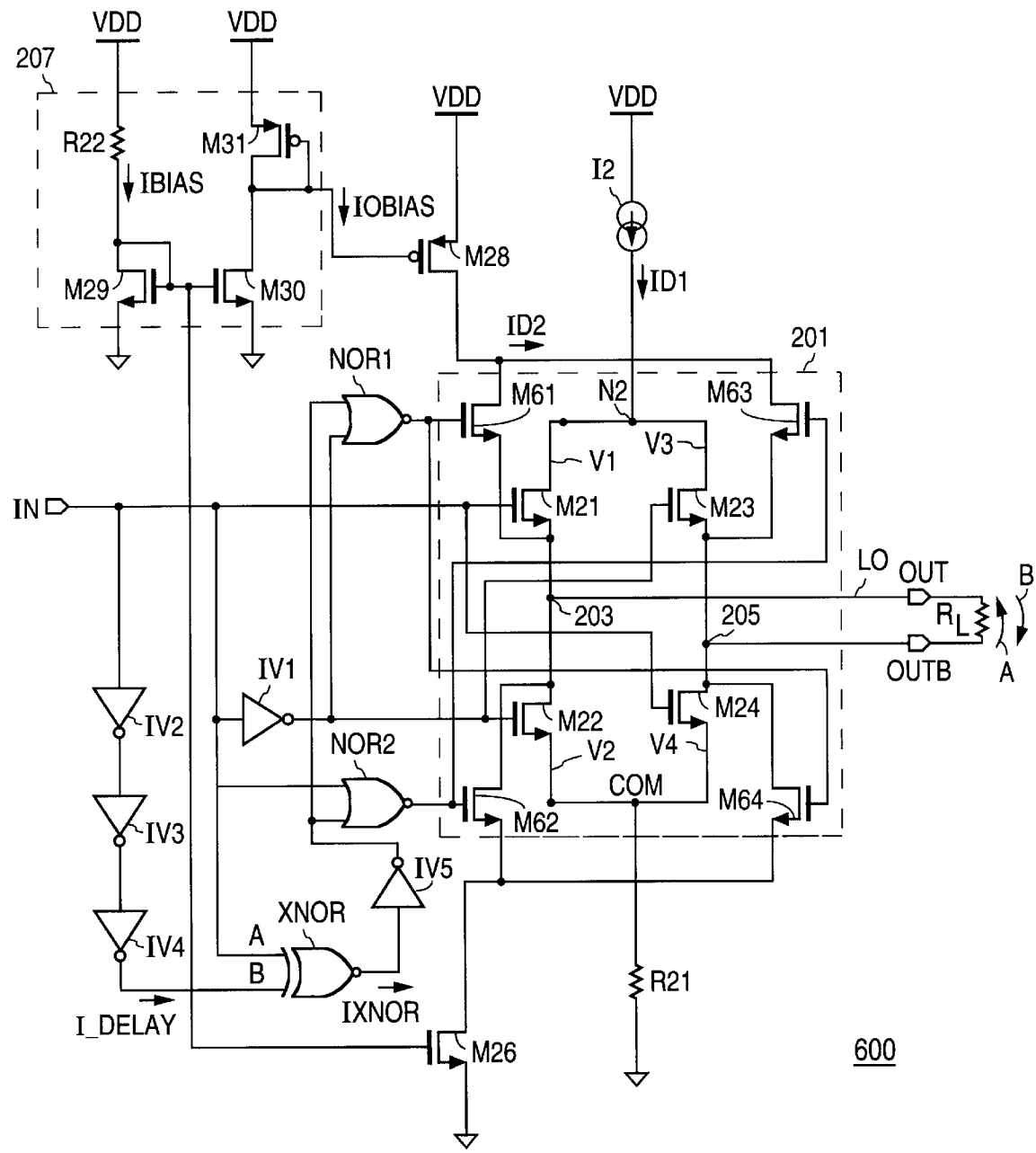
FIG. 6 illustrates low voltage differential signaling circuit in accordance with another embodiment of the present invention.

FIG. 6 illustrates an alternate embodiment of an LVDS driver with pre-emphasis 600. Recently, it has become necessary for many commercial integrated circuits to operate at less than the 3.3 Volt (±10%) power supply voltage. As a result, LVDS driver circuits must operate over a power supply range from over five volts down to 2.5 V (±10%) and less. One way to achieve operation at this lower voltage level is to increase the size of the transistors making up the LVDS driver. However, increasing the size of the transistors decreases the speed of the LVDS driver below the required speed of the circuit, which is undesirable. Thus, in the LVDS driver with pre-emphasis circuit 600 illustrated in FIG. 6 the transistors M21–M22 and new transistors M61–M64 have maintained the smaller size to maintain the fast switching rates.

To accomplish the objective of operating at lower voltages, such as 2.5 V, transistors M25 and M27 are not included in the LVDS driver with pre-emphasis circuit 600. Four new transistors M61–M64 now perform the pre-emphasis. The pre-emphasis pulse IXNOR that went to transistors M27 and M25 now goes to the four new transistors M61–M64. It will be appreciated that although transistors M21–M24 and M61–M64 are illustrated as NMOS transistors, any or all of these transistors may alternatively be configured as PMOS transistors.

In the embodiment illustrated in FIG. 6, two NOR gates NOR1, NOR2 gate the inverted pre-emphasis pulse $\overline{\text{IXNOR}}$ with the data signal IN so that for very fast data rates with narrow pulse widths, the duration of the pre-emphasis is limited to the duration of the data pulse. However, it will be appreciated that such NOR gates NOR1, NOR2 are optional and can be omitted when it is unlikely the duration of the data pulse will be less than the duration of the pre-emphasis pulse.

Transistors M61 and M64 steer drive current ID2 through resistive load RL in response to signals output from NOR gate NOR2 provided to the gates thereof. Similarly, transistors M62 and M63 steer drive current ID2 through resistive load RL in an alternate direction in response to signals output from NOR gate NOR1 provided to the gates thereof. In this way transistors M61–M64 operate in a manner similar to that of transistors M21–M24 to steer current in alternate directions through resistive load RL thereby producing a differential output signal. With this configuration of LVDS driver circuit with pre-emphasis 600, the pre-emphasis circuit (including transistors M26, M28 and M61–M64) and the LVDS line driver circuit work in parallel during the pre-emphasis phase thereby allowing more drive at that critical time.

The typical truth table for a NOR gate is shown below.

| c | d | Q |
|---|---|---|
| 0 | 0 | 1 |
| 0 | 1 | 0 |
| 1 | 0 | 0 |
| 1 | 1 | 0 |

Where "c" and "d" are inputs to the NOR gate and "Q" is the output of the NOR gate. Thus, the output Q of the NOR gate is only high when both inputs c, d are low.

Referring now to FIG. 6, the inverted output $\overline{IXNOR}$ of exclusive NOR gate XNOR and input signal IN are inputs to NOR gate NOR1, while the inverted output $\overline{IXNOR}$ of exclusive NOR gate XNOR and inverted input signal $\overline{IN}$ are inputs to NOR gate NOR2. Referring now to the table below, it can be seen that during a brief period of time when input signal IN and the inverted output $\overline{IXNOR}$ of exclusive NOR gate NOR are low, NOR gate NOR1 outputs a high signal.

| IN | $\overline{IXNOR}$ | NOR1 output |
|---|---|---|
| 0 | 0 | 1 |
| 0 | 1 | 0 |
| 1 | 0 | 0 |
| 1 | 1 | 0 |

Similarly, as shown in the table below, during a brief period of time when the inverted output $\overline{IXNOR}$ of exclusive NOR gate XNOR and inverted input signal $\overline{IN}$ are low, NOR gate NOR2 outputs a high signal.

| $\overline{IN}$ | $\overline{IXNOR}$ | NOR2 output |
|---|---|---|
| 0 | 0 | 1 |
| 0 | 1 | 0 |
| 1 | 0 | 0 |
| 1 | 1 | 0 |

When NOR gate NOR1 outputs a high signal, transistors M61, M64 turn on to conduct the pre-emphasis drive current ID2 through resistive load RL, and when NOR gate NOR2 outputs a high signal transistors M62, M63 turn on to conduct drive current ID2 through resistive load RL.

Figure 7:
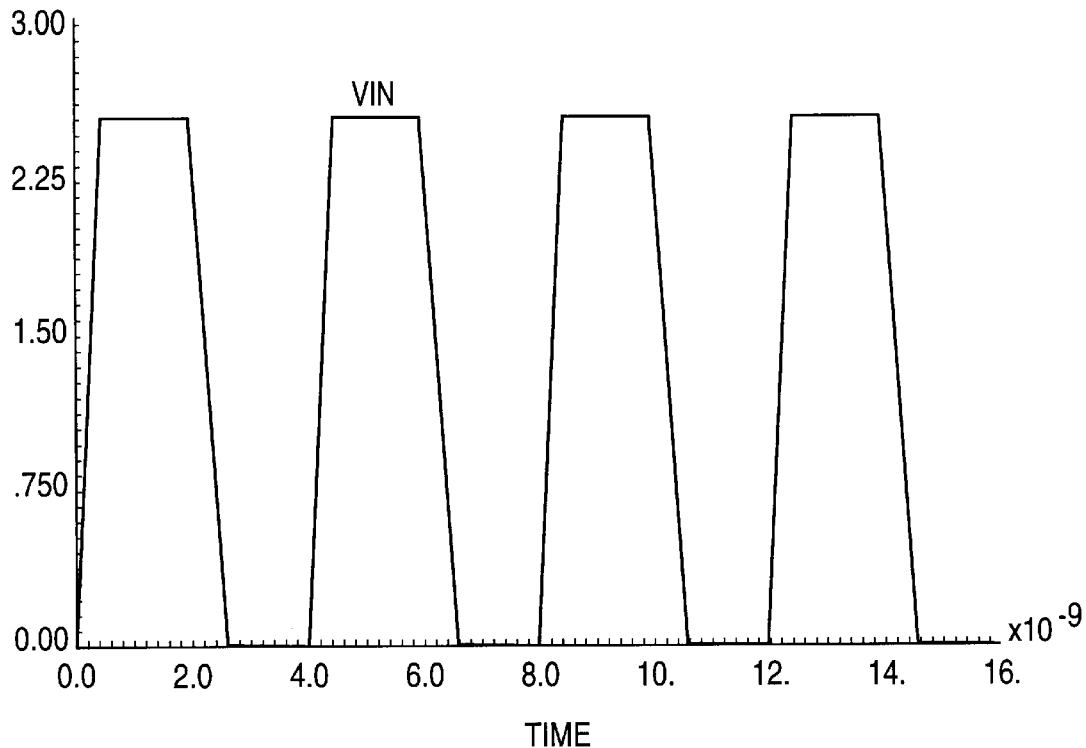
FIG. 7 illustrates a first transient signaling diagram of the low voltage differential signaling circuit in accordance with the present invention.
Figure 8:
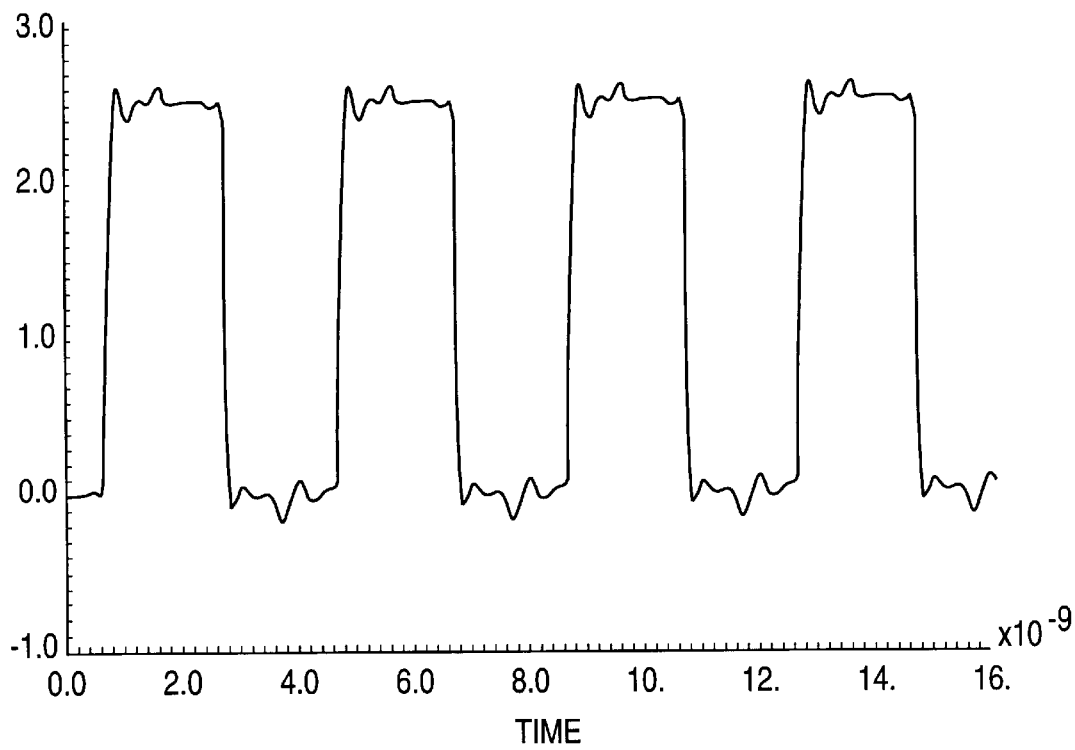
FIG. 8 illustrates a second transient signaling diagram of the low voltage differential signaling circuit in accordance with the present invention.
Figure 9:
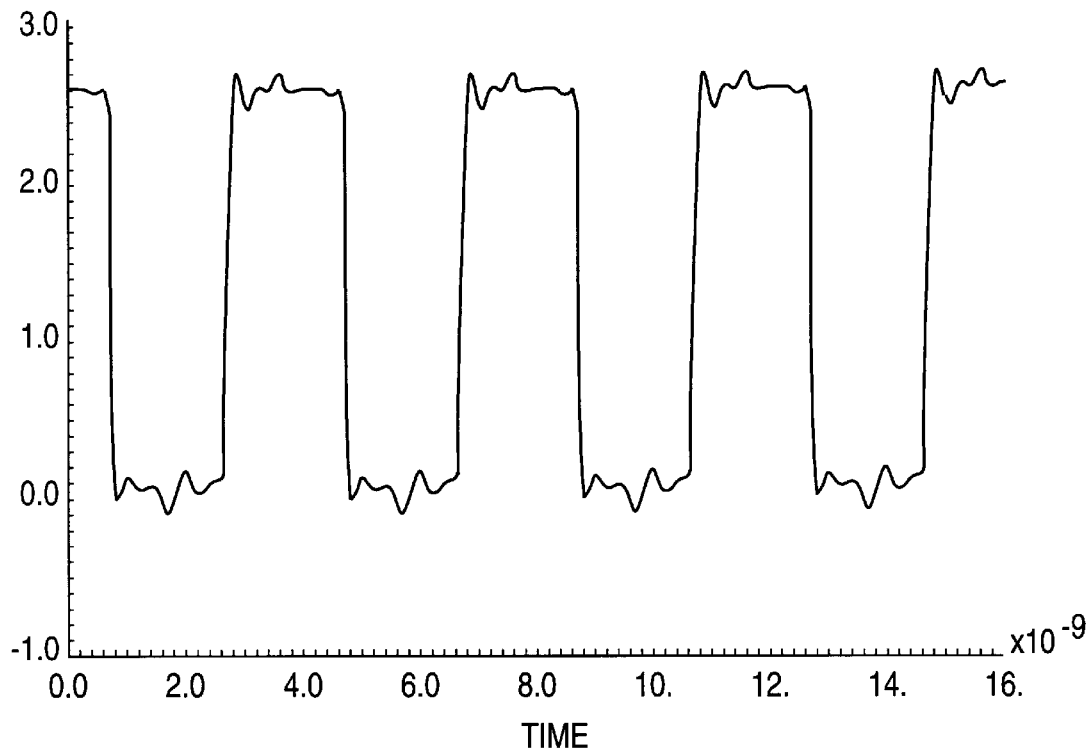
FIG. 9 illustrates a third transient signaling diagram of the low voltage differential signaling circuit in accordance with the present invention.

FIGS. 7–11 illustrates exemplary signaling diagrams of the signaling in accordance with the present invention. In particular, FIG. 7 illustrates data input signal IN. In this exemplary signaling diagram logical "1" corresponds to approximately 2.4 volts and logical "0" corresponds to approximately 0 volts. FIG. 8 illustrates an exemplary diagram of the data input signals applied to the gates of transistors M22 and M23, while FIG. 9 illustrates an exemplary diagram of the data input signals applied to the gates of transistors M21 and M24. It is in response to these exemplary data signals illustrated in FIGS. 8–9 that transistors M21–M24 steer drive current ID 1 through resistive load RL.

Figure 10:
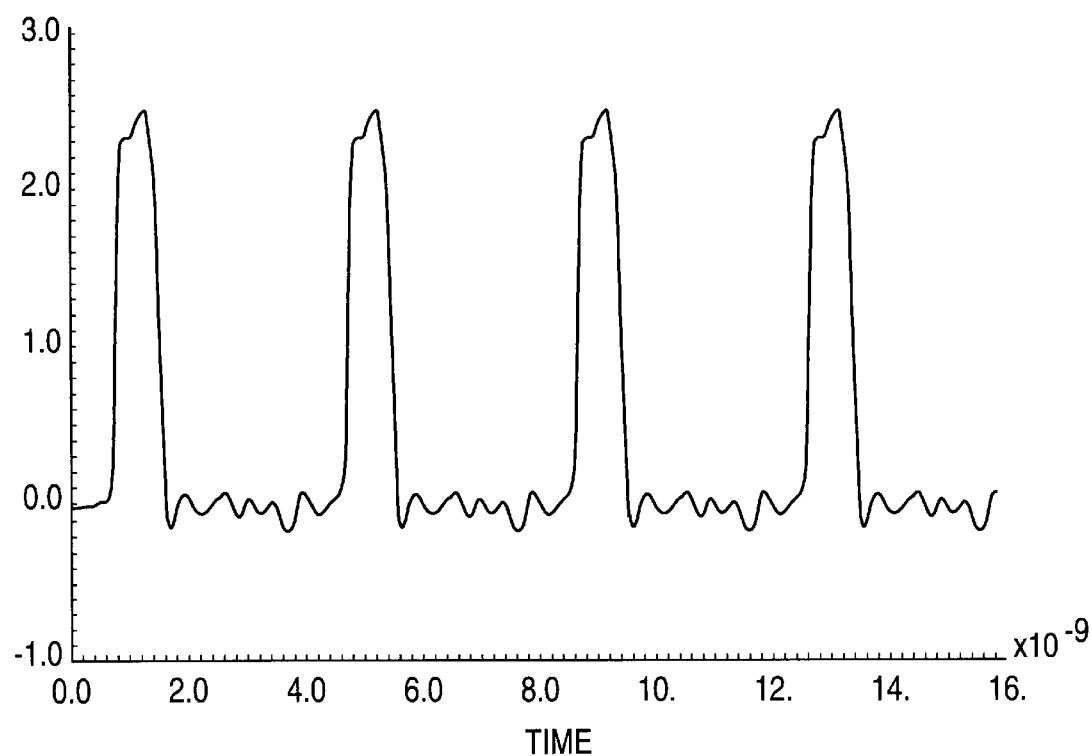
FIG. 10 illustrates a fourth transient signaling diagram of the low voltage differential signaling circuit in accordance with the present invention.
Figure 11:
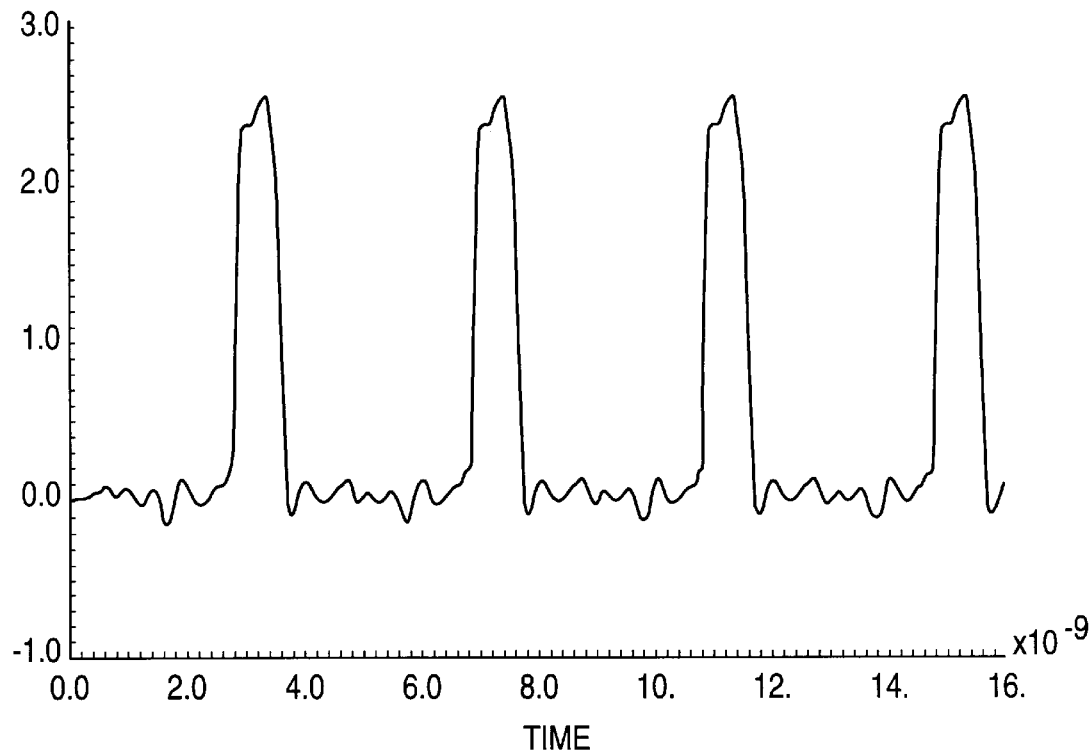
FIG. 11 illustrates a fifth transient signaling diagram of the low voltage differential signaling circuit in accordance with the present invention.

FIG. 10 illustrates an exemplary diagram of the pre-emphasis pulse output from NOR gate NOR2 that is applied to the gates of transistors M62 and M63, while FIG. 11 illustrates an exemplary diagram of the pre-emphasis pulse output from NOR gate NOR1 that is applied to the gates of transistors M61 and M64. It is in response to these exemplary pre-emphasis pulse signals that transistors M61–M64 turn on to provide pre-emphasis to the differential output signal across resistive load RL.

Referring now to FIGS. 8 and 10, it can be seen that pre-emphasis pulses have a shorter duration than the data input signals applied to transistors M22 and M23. In particular, in the exemplary embodiment shown in FIG. 8, the data signals have a duration of approximately 2 nanoseconds, whereas in the exemplary embodiment shown in FIG. 10, the pre-emphasis pulses have a duration of approximately 1 nanosecond. Thus, for the overlapping duration of approximately 1 nanosecond transistors M22 and M23, as well as transistors M62 and M63, conduct the first and second drive currents ID1, ID2, respectively.

Similarly, referring to FIGS. 9 and 11, it can be seen that pre-emphasis pulses in FIG. 11 have a shorter duration than the data input signals in FIG. 9 applied to transistors M21 and M24. For the overlapping duration of approximately 1 nanosecond transistors M21 and M24, as well as transistors M61 and M64, conduct the first and second drive currents ID1, ID2, respectively.

Figure 12:
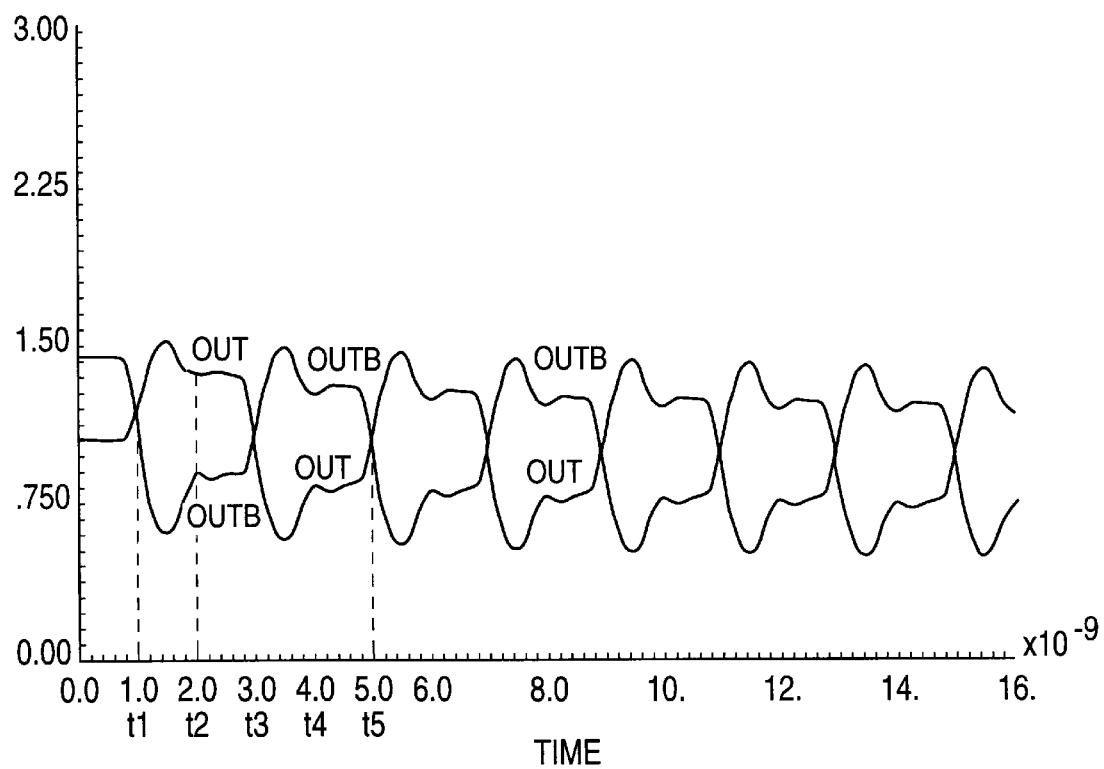
FIG. 12 illustrates a sixth transient signaling diagram of the low voltage differential signaling circuit in accordance with the present invention.

An exemplary differential signal output waveform is illustrated in FIG. 12. This waveform is made up of output signals OUT and OUTB at terminals 203 and 205, respectively, of LVDS driver with pre-emphasis circuit 600. As shown, output signals OUT and OUTB alternate between high and low signal states. In this exemplary embodiment, between times t1 and t3, which corresponds to the approximate period between 1 nanosecond and 3 nanoseconds, output signal OUT is high while output signal OUTB is low. Then between times t3 and t5, which corresponds to the approximate period between 3 and 5 nanoseconds, output signal OUT is low while output signal OUTB is high. It also can be seen that there is a brief sharp increase in signal level of output signals OUT and OUTB at the beginning of each transition from high to low or low to high. In this exemplary signaling diagram, the first brief sharp increase in the output signals OUT, OUTB occurs for slightly less than approximately 1 nanosecond (between times t1 and t2). The second brief sharp increase in the output signals OUT, OUTB occurs again for slightly less than approximately 1 nanosecond (between times t3 and t4). These brief sharp increases in signal level are the pre-emphasis from the second drive current ID2.

As with the previous embodiment of LVDS driver with pre-emphasis circuit 200, drive current ID2 is supplied to current steering circuit during the switching transition period of transistors M21–M24, corresponding to the transition of input signal IN. At this time, extra drive current ID2 flows from voltage supply VDD through transistor M28 to current steering circuit 201. As a result, more drive current is flowing into current steering circuit 201 than from current source 12 alone. Such additional current improves the transition time of LVDS driver with pre-emphasis 600.

This embodiment of LVDS driver with pre-emphasis circuit 600 requires less voltage than LVDS driver with pre-emphasis circuit 200, which is beneficial when the power supply voltage VDD decreases from 3.3 volts to 2.25 volts. Consider the following example of LVDS driver with pre-emphasis circuit 200 as shown in FIG. 2. In this example, the differential output signal swings between 1.0, which is the low voltage output signal VOL, and 1.4 volts, which is the high output voltage signal VOH. Thus, when the voltage at output terminal 203 is the high output voltage VOH at 1.4 volts, the maximum voltage drop from voltage supply VDD to output terminal 203 is 2.25 volts less 1.4 volts, which is 0.85 volts. Then since there are three transistors M21, M27 and M28 between voltage supply VDD and output terminal 203, assuming these transistors are all equally matched, the voltage drop across each transistor can be no more than 0.85 volts divided by 3, which is approximately 0.28 volts. Thus, the drain-to-source voltage for each transistor M21, M27 and M28 is approximately 0.28 volts.

In contrast, consider the same example with reference to LVDS driver with pre-emphasis circuit 600 as illustrated in FIG. 6. By eliminating transistor M27 of LVDS driver with pre-emphasis circuit 200 and placing transistor M61 in parallel with transistor M21, there become two rather than three transistors between voltage supply VDD and output terminal 203. Thus, each transistor between voltage supply VDD and output terminal 203 has more drain-to-source voltage available for operation. In particular, the drain-to-source voltage drop across each transistor M28 and M61 is 0.85 volts divided by 2, or approximately 0.42 volts. Similarly, the voltage drop across each of current source 12 and transistor M21 is approximately 0.42 volts. Thus, compared to LVDS driver with pre-emphasis circuit 200 which only had 0.28 volts for drain-to-source voltage for each transistors between voltage supply VDD and output terminals 203, 205, LVDS driver with pre-emphasis circuit 600 has more available headroom.

In addition, in LVDS driver with pre-emphasis circuit 200 switching transistors M21–M24 conduct drive current ID1 and ID2. However, in LVDS driver with pre-emphasis circuit 600 switching transistors M21–M24 conduct only drive current ID1. Since transistors M21–M24 conduct less current in LVDS driver with pre-emphasis circuit 600, these transistors M21–M24 operate more efficiently.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A line driver circuit that provides a differential signal to an external circuit, the line driver circuit comprising:
   a current steering circuit;
   a current source coupled to the current steering circuit and configured to provide a first drive current to the current steering circuit;
   a pre-emphasis circuit coupled to the current steering circuit and configured to receive an input signal switching between first and second signal states, and in accordance therewith provide a second drive current during a transition time beginning when the input signal switches between first and second signal states for a first time and ending before the input signal switches between first and second signal states for a second time; and
   first and second output nodes configured to couple to an external circuit and convey third and fourth drive currents, wherein
     the current steering circuit is configured to receive the input signal and in accordance therewith direct the first and second drive currents in first and second directions, respectively, to provide the third and fourth drive currents, wherein the third and fourth drive currents together form at the first and second output nodes a differential output signal, and
   wherein the pre-emphasis circuit includes
   a current sinking circuit coupled to the current steering circuit;
   a current sourcing circuit coupled to the current steering circuit, and
   wherein during the transition time the current sourcing circuit pushes the second drive current into the current steering circuit and the current sinking circuit sinks a portion of a combination of the first and second drive currents from the current steering circuit, and
   wherein the pre-emphasis circuit further includes
   a logic circuit coupled to the current sinking circuit and the current sourcing circuit; and
   a delay circuit coupled to the logic circuit and configured to receive the input signal and in accordance therewith generate a delayed input signal having first and second signal states, and wherein the logic circuit receives the input signal and the delayed input signal and in accordance therewith outputs a transition signal during the transition time, the transition time beginning when the input signal switches between first and second signal states and ending when the delayed input signal switches between first and second signal states.

2. The line driver circuit of claim 1, and wherein the delay circuit comprises a plurality of inverter circuits.

3. The line driver circuit of claim 1, and wherein the logic circuit comprises an exclusive-NOR circuit.

4. The line driver circuit of claim 1, and further comprising a bias circuit coupled to the current sourcing circuit and the current sinking circuit and configured to provide first and second bias signals to the current sourcing circuit and the current sinking circuit, respectively.

5. The line driver circuit of claim 1, and wherein the current sourcing circuit includes:
   a first sourcing transistor coupled to the current steering circuit; and
   a second sourcing transistor coupled to the first sourcing transistor and to a first supply voltage, and configured to receive a first bias signal, the current sinking circuit includes:
   a first sinking transistor coupled to the current steering circuit; and
   a second sinking transistor coupled to the first sinking transistor and to a second supply voltage, and configured to receive a second bias signal, the pre-emphasis circuit further includes:
   a logic circuit coupled to the first sourcing transistor and the first sinking transistor; and
   a delay circuit coupled to the logic circuit and configured to receive the input signal and in accordance therewith provide a delayed input signal having first and second signal states, and wherein the logic circuit receives the input signal and the delayed input signal and in accordance therewith outputs a transition signal during the transition time corresponding to a time when both the input signal and the delayed input signal have the same signal states, the first sourcing transistor receives the transition signal and in accordance therewith provides the second drive signal from the first supply voltage through the second sourcing transistor to the current steering circuit, and the first sinking transistor receives the transition signal and in accordance therewith sinks the portion of the combination of the first and second drive currents from the current steering circuit through the second sinking transistor to the second supply voltage.

6. The line driver circuit of claim 1, and wherein the pre-emphasis circuit includes:

a current sourcing circuit coupled to the current steering circuit and to a first supply voltage;

a current sinking circuit coupled to the current steering circuit and to a second supply voltage;

an exclusive-NOR gate coupled to the current sinking circuit and to the current sourcing circuit; and a delay circuit coupled to the exclusive-NOR gate and configured to receive the input signal and in accordance therewith generate a delayed input, wherein the exclusive-NOR gate receives the input signal and the delayed input signal and in accordance therewith outputs a transition during the transition time, the transition time beginning when the input signal switches between first and second signal states and ending when the delayed input signal switches between first and second signal states, the current sourcing circuit receives the transition signal and in accordance therewith conducts the second drive current from the first supply voltage to the current steering circuit, and the current sinking circuit receives the transition signal and in accordance therewith conducts a portion of a combination of the first and second drive currents from the current steering circuit to the second supply voltage.

7. A method for increasing an output drive capability of a line driver circuit, the method comprising the steps of:

providing a first drive current to a current steering circuit;

receiving an input signal having first and second signal states and in accordance therewith outputting a transition signal during a transition time beginning when the input signal switches between first and second signal states for a first time and ending before the input signal switches between first and second signal states for a second time;

receiving the transition signal and in accordance therewith sourcing a second drive current into the current steering circuit and sinking a portion of a combination of the first and second drive currents from the current steering circuit during the transition time;

conveying third and fourth drive currents via first and second output nodes which are coupled to an external circuit; and receiving the input signal by the current steering circuit and in accordance therewith directing the first and second drive currents in first and second directions to provide third and fourth drive currents, wherein the third and fourth drive currents together form at the first and second output nodes a differential output signal and wherein the first and second drive currents together provide an increased drive capability, and wherein the step of receiving the transition signal and in accordance therewith sourcing a second drive current into the current steering circuit and sinking a portion of a combination of the first and second drive currents from the current steering circuit during the transition time includes:

receiving the transition signal by a current sourcing circuit and in accordance therewith pushing the second drive current from a voltage supply into the current steering circuit; and receiving the transition signal by a current sinking circuit and in accordance therewith sinking the portion of the combination of the first and second drive currents to a circuit ground, and wherein the step of receiving an input signal having first and second signal states and in accordance therewith outputting a transition signal during a transition time beginning when the input signal switches between first and second signal states for a first time and ending before the input signal switches between first and second signal states for a second time includes delaying the input signal to generate a delayed input signal having first and second signal states;

receiving the input signal and the delayed input signal and in accordance therewith outputting a transition signal during the transition time corresponding to a time when both the input signal and the delayed input signal have the same signal state; and receiving the transition signal and in accordance therewith pushing the second drive current into the current steering circuit during the transition time.

8. An apparatus including a line driver circuit, comprising:

a current steering circuit;

a current source coupled to the current steering circuit; and a pre-emphasis circuit coupled to the current steering circuit, the pre-emphasis circuit comprising a bias source, a current sourcing circuit coupled to the bias source and connected directly to the current steering circuit, and a current sinking circuit coupled to the bias source and the current steering circuit, and wherein the pre-emphasis circuit further includes a logic circuit coupled to the current sourcing circuit and the current sinking circuit and a delay circuit coupled to the logic circuit.

9. The apparatus of claim 8, and wherein the delay circuit comprises a plurality of inverters.

10. The apparatus of claim 8, and wherein the logic circuit comprises an exclusive NOR gate.

11. The apparatus of claim 8, and wherein the current source and the current sourcing circuit couple to the current steering circuit at a first node, and the current sinking circuit couples to the current steering circuit at a second node.

12. The apparatus of claim 8, and wherein the current sourcing circuit and the current source couple to the current steering circuit at a common node.

13. The apparatus of claim 8, and wherein the current source current couples to the current steering circuit at a first node, the current sourcing circuit couples to the current steering circuit at second and third nodes, and the current sinking circuit couples to the current steering circuit at the second and third nodes.

14. The apparatus of claim 13, and wherein the second and third nodes comprise receiving ends of a pair of transmission lines.

15. The apparatus of claim 13, and wherein the pre-emphasis circuit further comprises:
   a logic circuit coupled to the current sourcing circuit and the current sinking circuit; and
   a delay circuit coupled to the logic circuit.

16. The apparatus of claim 15, and wherein the logic circuit comprises:
   an exclusive-NOR gate coupled to the delay circuit; and
   a plurality of NOR gates coupled to the exclusive NOR gate, the current sourcing circuit and the current sinking circuit.

17. An apparatus including a line driver circuit, comprising:
   a first current steering circuit;
   a current source coupled to the first current steering circuit;
   a second current steering circuit coupled to the first current steering circuit;
   a current sourcing circuit coupled to the second current steering circuit; and
   a bias source coupled to the current sourcing circuit, and
   a current sinking circuit coupled to the second current steering circuit, and wherein
   the current source current couples to the current steering circuit at a first node, and
   the second current steering circuit couples to the first current steering circuit at second and third nodes.

18. The apparatus of claim 17, and wherein the second and third nodes comprise receiving ends of a pair of transmission lines.

19. The apparatus of claim 17, and further comprising:
   a logic circuit coupled to the second current steering circuit; and
   a delay circuit coupled to the logic circuit.

20. The apparatus of claim 19, and wherein the logic circuit comprises:
   an exclusive-NOR gate coupled to the delay circuit; and
   a plurality of NOR gates coupled to the exclusive NOR gate and the second current steering circuit.

21. A method for increasing an output drive capability of a line driver circuit, the method comprising:
   receiving a first drive current for a first time period;
   receiving a second drive current for a second time period, wherein the second time period and the first time period overlap;
   steering the first drive current in first and second directions;
   steering the second drive current in a same direction as the first drive current to provide an output signal proportional to a sum of the first and second drive currents; and
   receiving an input signal having first and second input signal states;
   delaying the input signal to generate a delayed input signal having first and second delayed signal states;
   receiving the input signal and the delayed input signal and in accordance therewith outputting a transition signal during a first transition time when both the input signal and the delayed input signal have a same signal state; and
   receiving the transition signal and in accordance therewith sourcing the second drive current during the first transition time.

22. The method of claim 21, and wherein the first time period is longer than the second time period.

23. The method of claim 21, and further comprising:
   receiving a first input signal and in accordance therewith sourcing the first drive current; and
   receiving a second input signal and in accordance therewith sourcing the second drive current.

24. The method of claim 21, and wherein the first transition time begins when the input signal switches between first and second input signal states and ends when the delayed input signal switches between the first and second delayed signal states.

25. The method of claim 21, and wherein the step of steering the first drive current comprises the step of:
   receiving the input signal and in accordance therewith sourcing a first drive current during a second transition time, wherein the second transition time overlaps with the first transition time when both the input signal and the delayed input signal have a same signal state.

26. The method of claim of claim 25, and wherein the second transition time begins when the input signal switches from the first to the second input signal state and ends when the input signal switches from the second to the first input signal state.

27. An apparatus including a line driver circuit, comprising:
   means for providing a first drive current;
   means for providing a second drive current;
   means for sourcing the second drive current for a first time period; and
   means for receiving the second drive current during the first time period and the first drive current during a second time period, wherein the second time period and the first time period overlap, and in accordance therewith steering the first and second drive currents together in first and second directions to provide an output signal proportional to a sum of the first and second drive currents; and
   means for sinking the first and second drive currents steered in first and second directions; and
   wherein the means for receiving the second drive current during the first time period and the first drive current during a second time period includes:
      means for receiving an input signal having first and second signal states and in accordance therewith providing a delayed input signal having delayed first and second signal states;
      means for receiving the input signal and the delayed input signal and in accordance therewith generating a pre-emphasis signal during the first time period when the input signal and the delayed input signal have a same signal state;
      means for receiving the pre-emphasis signal and in accordance therewith sourcing the second drive current from the means for providing a second drive current; and
      means for steering the first and second drive currents together in first and second directions to provide the output signal proportional to the sum of the first and second drive currents.

28. The apparatus of claim 27, and wherein the means for steering comprises:
   a first means for steering the first drive current in the first and second directions; and
   a second means for steering the second drive current in the first and second directions.

* * * * *